United States Patent
Lee et al.

(10) Patent No.: US 10,693,453 B1
(45) Date of Patent: Jun. 23, 2020

(54) POWER SWITCH CIRCUIT

(71) Applicant: Excelliance MOS Corporation, Hsinchu County (TW)

(72) Inventors: Ching-Tsan Lee, Hsinchu County (TW); Ke-Wei Wu, Hsinchu County (TW); Pei-Ting Yang, Hsinchu County (TW)

(73) Assignee: Excelliance MOS Corporation, Hsinchu County (TW)

( * ) Notice: Subject to any disclaimer, the term of this patent is extended or adjusted under 35 U.S.C. 154(b) by 0 days.

(21) Appl. No.: 16/593,971

(22) Filed: Oct. 4, 2019

(30) Foreign Application Priority Data

Aug. 8, 2019 (TW) .............................. 108128181 A

(51) Int. Cl.
*H02M 3/07* (2006.01)
*H03K 17/16* (2006.01)

(52) U.S. Cl.
CPC .............. *H03K 17/163* (2013.01); *H02M 3/07* (2013.01)

(58) Field of Classification Search
CPC ................................ H03K 17/163; H02M 3/07
USPC ........................................................ 327/109
See application file for complete search history.

(56) References Cited

U.S. PATENT DOCUMENTS

| | | | |
|---|---|---|---|
| 10,320,180 B1* | 6/2019 | Venigalla | H01R 13/6666 |
| 10,574,230 B1* | 2/2020 | Wu | H02M 3/07 |
| 2015/0364997 A1* | 12/2015 | Deng | H02M 3/1582 323/271 |
| 2017/0047731 A1* | 2/2017 | Manohar | H03K 5/08 |
| 2017/0317583 A1* | 11/2017 | Forghani-Zadeh | H03K 17/04206 |
| 2019/0036521 A1* | 1/2019 | Wu | H03K 17/0822 |
| 2019/0305686 A1* | 10/2019 | Watanabe | H02M 1/10 |
| 2020/0014192 A1* | 1/2020 | Ramachandran | G01R 19/16519 |
| 2020/0052584 A1* | 2/2020 | Watanabe | H03K 17/6871 |
| 2020/0052607 A1* | 2/2020 | Telefus | H02J 13/00007 |

\* cited by examiner

*Primary Examiner* — Ryan Jager
(74) *Attorney, Agent, or Firm* — JCIPRNET

(57) ABSTRACT

A power switch circuit including first and second transistors, and a control circuit is provided. A first end of the first transistor serves as an input terminal of the power switch circuit. A second end of the first transistor is coupled to a node. A control end of the first transistor receives a first control voltage. A first end of the second transistor serves as an output terminal of the power switch circuit. A second end of the second transistor is coupled to the node. A control end of the second transistor receives a second control voltage. The control circuit detects a voltage of the node to determine a type of series connection between the first and second transistors, and generates the first and second control voltages to control a turned-on state of another of the first and second transistors after turning on one of the first and second transistors.

11 Claims, 8 Drawing Sheets

POWER SWITCH CIRCUIT

CROSS-REFERENCE TO RELATED APPLICATION

This application claims the priority benefit of Taiwan application serial no. 108128181, filed on Aug. 8, 2019. The entirety of the above-mentioned patent application is hereby incorporated by reference herein and made a part of this specification.

TECHNICAL FIELD

The invention relates to a power circuit, and more particularly, relates to a back-to-back power switch circuit capable of preventing a soft start failure.

BACKGROUND

In circuit design with transistors used as a power switch, the designer usually implements the power switch by using two transistors in a back-to-back series connection to prevent a parasitic diode inside the transistor (i.e., a base diode) from being turned on and causing a situation where the power switch cannot be completely turned off. However, because the two transistors may have different threshold voltages, when the power switch conducts a soft start, the two transistors may not be able to switch from a turned-off state to a turned-on state at the same time. If a time interval in which one of the transistors is switched from the turned-off state to the turned-on state only partially overlaps with a time interval in which the other transistor is switched from the turned-off state to the turned-on state, an overall equivalent resistance variation of the two transistor becomes unsmoothed. Consequently, during startup, the power switch will generate an inrush current, which leads to the soft start failure.

SUMMARY

In consideration of the above, the invention provides a power switch circuit. A first transistor and a second transistor in the back-to-back series connection are provided between an input terminal and an output terminal of the power switch circuit. The power switch circuit can control a turned-on state of another of the first transistor and the second transistor after completely turning on one of the first transistor and the second transistor, so as to prevent the soft start failure.

The power switch circuit of the invention includes the second transistor, the second transistor and a control circuit. The first transistor has a first end, a second end and a control end. The first end of the first transistor is configured to serve as the input terminal of the power switch circuit. The second end of the first transistor is coupled to a node. The control end of the first transistor is configured to receive a first control voltage. The second transistor has a first end, a second end and a control end. The first end of the second transistor is configured to serve as the output terminal of the power switch circuit. The second end of the second transistor is coupled to the node. The control end of the second transistor is configured to receive a second control voltage. The control circuit is coupled to the node, the control end of the first transistor and the control end of the second transistor. The control circuit detects a voltage of the node, determines a type of series connection between the first transistor and the second transistor according to the voltage of the node, and generates the first control voltage and the second control voltage according to the type of series connection, so as to start controlling a turned-on state of another of the first transistor and the second transistor after completely turning on one of the first transistor and the second transistor.

Based on the above, in the power switch circuit of the invention, the control circuit can determine the type of series connection between the first transistor and the second transistor, and controls the first transistor and the second transistor according to the type of series connection between the first transistor and the second transistor. The control circuit controls the turned-on state of another of the first transistor and the second transistor after completely turning on one of the first transistor and the second transistor. In this way, the time interval in which the first transistor is switched from the turned-off state to the turned-on state does not overlap with the time interval in which the second transistor is switched from the turned-off state to the turned-on state at all. As a result, the soft start failure caused by the inrush current generated by the power switch circuit during the startup can be prevented.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DETAILED DESCRIPTION

Figure 1:
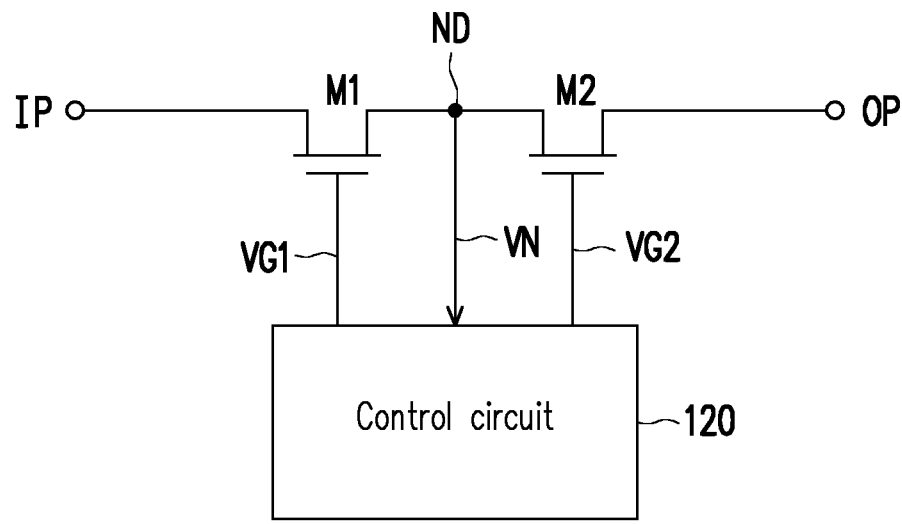
FIG. 1 is a circuit block diagram illustrating a power switch circuit according to an embodiment of the invention.

In order to make content of the invention more comprehensible, embodiments are described below as the examples to prove that the invention can actually be realized. Moreover, elements/components/steps with same reference numerals represent same or similar parts in the drawings and embodiments.

FIG. 1 is a circuit block diagram illustrating a power switch circuit 100 according to an embodiment of the invention. Referring to FIG. 1, the power switch circuit 100 can include a first transistor M1, a second transistor M2, and a control circuit 120. The first transistor M1 has a first end, a second end and a control end. The first end of the first transistor M1 is configured to serve as an input terminal IP of the power switch circuit 100. The second end of the first transistor M1 is coupled to a node ND. The control end of the first transistor M1 is configured to receive a first control voltage VG1. The second transistor M2 has a first end, a second end and a control end. The first end of the second transistor M2 is configured to serve as an output terminal OP of the power switch circuit 100. The second end of the second transistor M2 is coupled to the node ND. The control end of the second transistor M2 is configured to receive a second control voltage VG2.

The control circuit 120 is coupled to the node ND, the control end of the first transistor M1 and the control end of the second transistor M2. The control circuit 120 can detect a voltage VN of the node ND. The control circuit 120 can determine a type of series connection between the first transistor M1 and the second transistor M2 according to the voltage VN of the node ND, and generates the first control voltage VG1 and the second control voltage VG2 according to the type of series connection, so as to start controlling a turned-on state of another of the first transistor M1 and the second transistor M2 after completely turning on one of the first transistor M1 and the second transistor M2. In this way, a time interval in which the first transistor M1 is switched from a turned-off state to a turned-on state partially overlapping with a time interval in which the second transistor M2 is switched from the turned-off state to the turned-on state can be prevented. Therefore, the soft start failure caused by the inrush current generated by the power switch circuit 100 during the startup can be prevented.

In an embodiment of the invention, the type of series connection between the first transistor M1 and the second transistor M2 may be, for example, a common source type of series connection or a common drain type of series connection.

Figure 2:
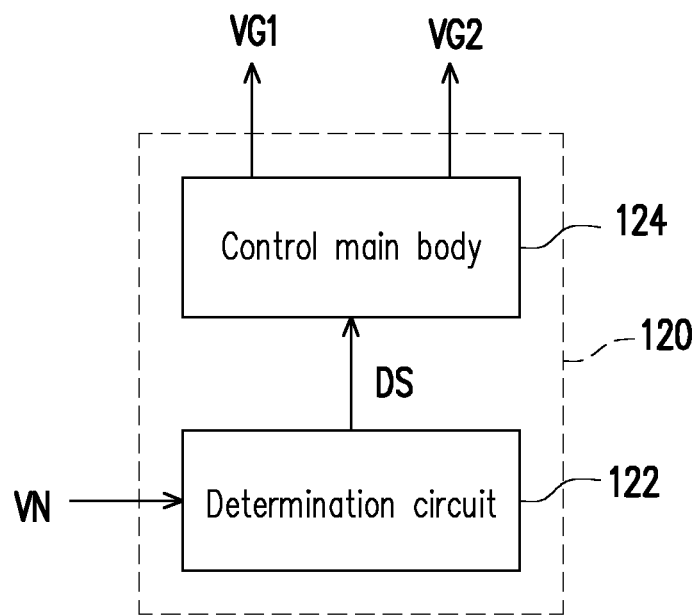
FIG. 2 is a circuit block diagram illustrating a control circuit according to an embodiment of the invention.

FIG. 2 is a circuit block diagram illustrating the control circuit 120 according to an embodiment of the invention. Referring to FIG. 1 and FIG. 2 together, the control circuit 120 can include a determination circuit 122 and a control main body 124. The determination circuit 122 is configured to detect the voltage VN of the node ND, determine the type of series connection between the first transistor M1 and the second transistor M2 according to the voltage VN of the node ND, and generate a determination signal DS. The control main body 124 is coupled to the determination circuit 122 to receive the determination signal DS, and generates the first control voltage VG1 and the second control voltage VG2 according to the determination signal DS.

Figure 3A:
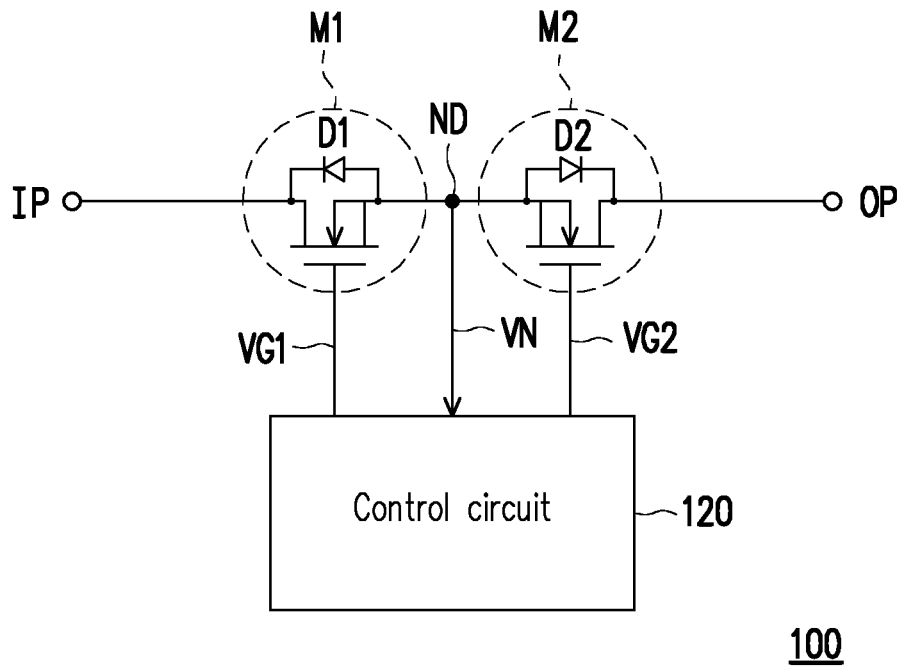
FIG. 3A is a schematic diagram illustrating a type of series connection between a first transistor and a second transistor in a power switch circuit being a common source type of series connection according to an embodiment of the invention.

FIG. 3A is a schematic diagram illustrating the type of series connection between the first transistor M1 and the second transistor M2 being the common source type of series connection according to an embodiment of the invention. Referring to FIG. 2 and FIG. 3A together, each of the first transistor M1 and the second transistor M2 is an N-type metal-oxide-semiconductor field-effect transistor, and the first transistor M1 and the second transistor M2 are connected in series with a common source. In detail, a drain end of the first transistor M1 serves as the input terminal IP of the power switch circuit 100, and a source end and a base of the first transistor M1 are coupled together and coupled to the node ND. A parasitic diode D1 is included between the base and the drain end of the first transistor M1. A drain end of the second transistor M2 serves as the output terminal OP of the power switch circuit 100, and a source end and a base of the second transistor M2 are coupled together and coupled to the node ND. A parasitic diode D2 is included between the base and the drain end of the second transistor M2.

After power is supplied to the input terminal IP of the power switch circuit 100 and before the power switch circuit 100 is started, the first transistor M1 and the second transistor M2 are in the turned-off state, and the parasitic diode D1 in the first transistor M1 is reverse bias so that the voltage VN of the node ND is at low potential. Therefore, the determination circuit 122 can determine that the type of series connection between the first transistor M1 and the second transistor M2 is the common source type of series connection according to the voltage VN of the node ND at low potential. If the determination signal DS generated by the determination circuit 122 indicates that the type of series connection between the first transistor M1 and the second transistor M2 is the common source type of series connection, the control main body 124 starts switching over to the first control voltage VG1 to turn on the first transistor M1 after switching over to the second control voltage VG2 to completely turn on the second transistor M2. Here, the time interval in which the first transistor M1 is switched from the turned-off state to the turned-on state does not overlap with the time interval in which the second transistor M2 is switched from the turned-off state to the turned-on state.

Figure 3B:
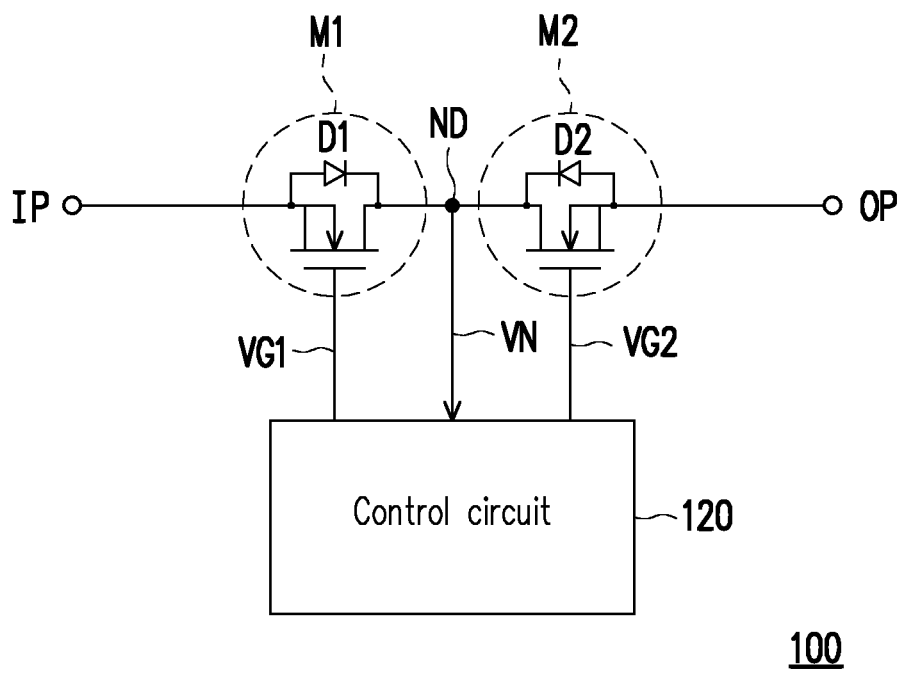
FIG. 3B is a schematic diagram illustrating a type of series connection between a first transistor and a second transistor in a power switch circuit being a common drain type of series connection according to another embodiment of the invention.

FIG. 3B is a schematic diagram illustrating the type of series connection between the first transistor M1 and the second transistor M2 being the common drain type of series connection according to another embodiment of the invention. Referring to FIG. 2 and FIG. 3B together, each of the first transistor M1 and the second transistor M2 is the N-type metal-oxide-semiconductor field-effect transistor, and the first transistor M1 and the second transistor M2 are connected in series with a common drain. In detail, the source end and the base of the first transistor M1 are coupled together to serve as the input terminal IP of the power switch circuit 100, and the drain end of the first transistor M1 is coupled to the node ND. The parasitic diode D1 is included between the base and the drain end of the first transistor M1. The source end and the base of the second transistor M2 are coupled together to serve as the output terminal OP of the power switch circuit 100, and the drain end of the second transistor M2 is coupled to the node ND. The parasitic diode D2 is included between the base and the drain end of the second transistor M2.

After power is supplied to the input terminal IP of the power switch circuit 100 and before the power switch circuit 100 is started, the first transistor M1 and the second transistor M2 are in the turned-off state, and the parasitic diode D1 in the first transistor M1 is forward bias so that the voltage VN of the node ND is at high potential. Therefore, the determination circuit 122 can determine that the type of series connection between the first transistor M1 and the second transistor M2 is the common drain type of series connection according to the voltage VN of the node ND at high potential. If the determination signal DS generated by the determination circuit 122 indicates that the type of series connection between the first transistor M1 and the second transistor M2 is the common drain type of series connection, the control main body 124 starts switching over to the second control voltage VG2 to turn on the second transistor M2 after switching over to the first control voltage VG1 to completely turn on the first transistor M1. Here, the time interval in which the first transistor M1 is switched from the turned-off state to the turned-on state does not overlap with the time interval in which the second transistor M2 is switched from the turned-off state to the turned-on state.

Figure 4:
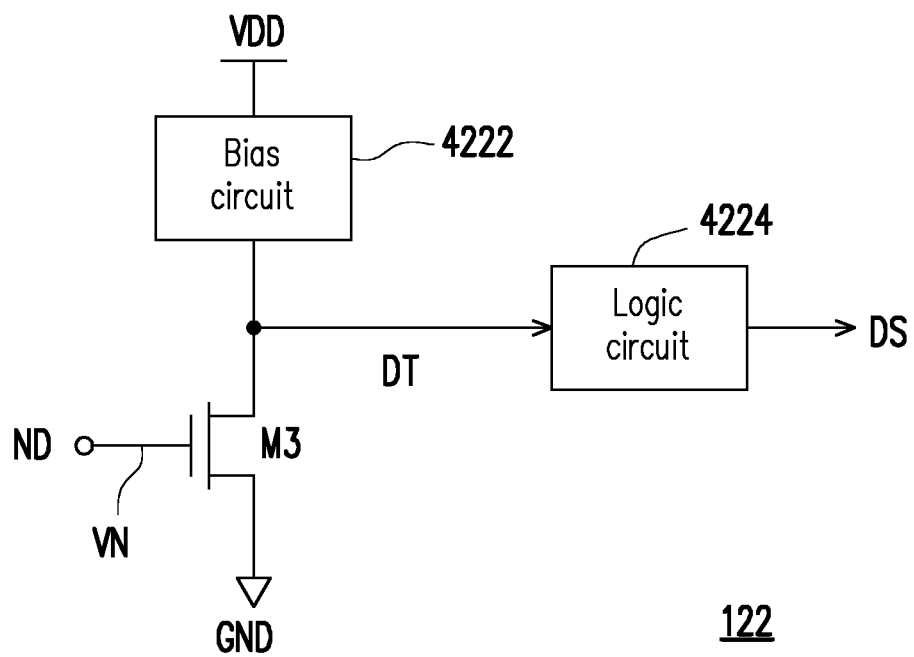
FIG. 4 is a circuit block diagram illustrating a determination circuit of FIG. 2 according to an embodiment of the invention.

FIG. 4 is a circuit block diagram illustrating the determination circuit 122 of FIG. 2 according to an embodiment of the invention. Referring to FIG. 4, the determination circuit 122 can include a third transistor M3, a bias circuit 4222 and a logic circuit 4224. A first end of the third transistor M3 is coupled to a ground terminal GND. A control end of the third transistor M3 is coupled to the node ND. A first end of the bias circuit 4222 is coupled to a second end of the third transistor M3 to generate a detection signal DT. A second end of the bias circuit 4222 is coupled to a power terminal VDD. The logic circuit 4224 is coupled to the first end of the bias circuit 4222 and the second end of the third transistor M3 to receive the detection signal DT, and generates the determination signal DS according to the detection signal DT.

In an embodiment of the invention, the bias circuit 422 may be a resistor or a current source circuit, but the invention is not limited thereto.

More specifically, when the voltage VN of the node ND is at low potential, the third transistor M3 is turned off so that the detection signal DT is at high potential. The logic circuit 4224 can determine that the type of series connection between the first transistor M1 and the second transistor M2 is the common source type of series connection according to the detection signal DT at high potential, and accordingly generate the corresponding determination signal DS. Similarly, when the voltage VN of the node ND is at high potential, the third transistor M3 is turned on so that the detection signal DT is at low potential. The logic circuit 4224 can determine that the type of series connection between the first transistor M1 and the second transistor M2 is the common drain type of series connection according to the detection signal DT at low potential, and accordingly generate the corresponding determination signal DS.

Figure 5:
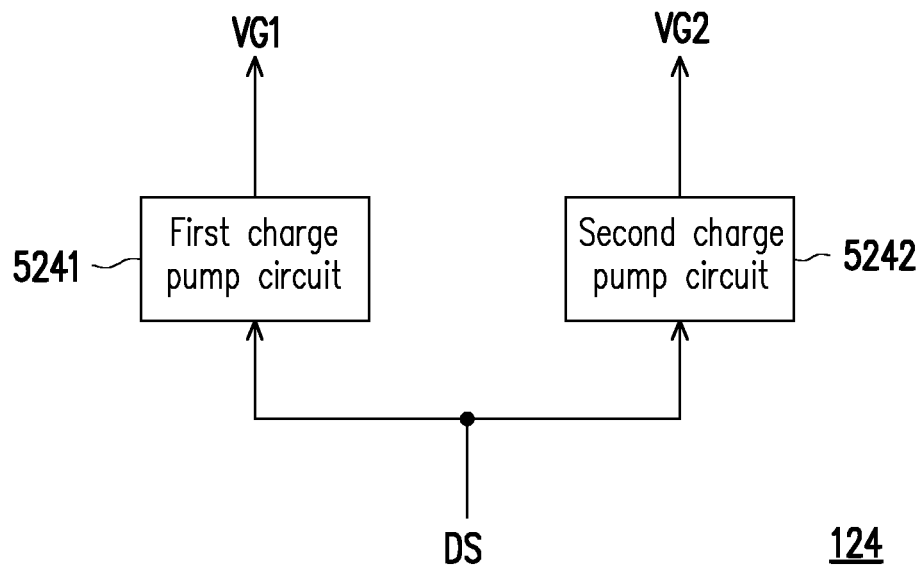
FIG. 5 is a circuit block diagram illustrating a control main body of FIG. 2 according to an embodiment of the invention.

FIG. 5 is a circuit block diagram illustrating the control main body 124 of FIG. 2 according to an embodiment of the invention. Referring to FIG. 2 and FIG. 5 together, the control main body 124 can include a first charge pump circuit 5241 and a second charge pump circuit 5242. The first charge pump circuit 5241 is coupled to the determination circuit 122 to receive the determination signal DS, and generates the first control voltage VG1 according to the determination signal DS. The second charge pump circuit 5242 is coupled to the determination circuit 122 to receive the determination signal DS, and generates the second control voltage VG2 according to the determination signal DS.

In an embodiment of the invention, the first charge pump circuit 5241 and the second charge pump circuit 5242 may be implemented by adopting the existing charge pumps.

Figure 6A:
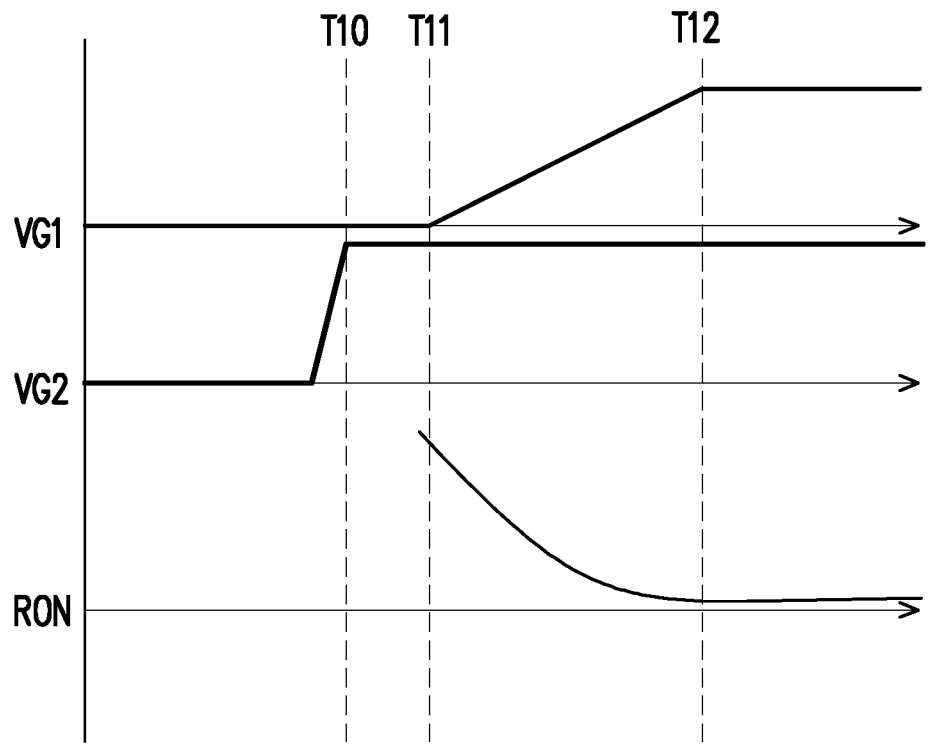
FIG. 6A is a waveform diagram of a first control voltage, a second control voltage, and an equivalent resistance between an input terminal and an output terminal of FIG. 3A according to an embodiment of the invention.

Operations of the control main body 124 of FIG. 5 will be described below with reference to FIG. 3A and FIG. 6A. FIG. 6A is a waveform diagram of the first control voltage VG1, the second control voltage VG2, and an equivalent resistance RON between the input terminal IP and the output terminal OP of FIG. 3A according to an embodiment of the invention. Referring to FIG. 3A, FIG. 5 and FIG. 6A together, in this embodiment, the determination signal DS of FIG. 5 indicates that the type of series connection between the first transistor M1 and the second transistor M2 of FIG. 3A is the common source type of series connection. Therefore, after the second charge pump circuit 5242 generates the second control voltage VG2 to completely turn on the second transistor M2 (i.e., after a time point T10 of FIG. 6A), the first charge pump circuit 5241 starts generating the first control voltage VG1 to turn on the first transistor M1 at a time point T11, and completely turns on the first transistor M1 after a time point T12 to complete a soft start operation of the power switch circuit 100. It should be understood that, the second transistor M2 is completely turned on during a soft start interval between the time points T11 and T12. Therefore, the equivalent resistance RON between the input terminal IP and the output terminal OP is substantially controlled only by the first control voltage VG1 and smoothly changed from high impedance to low impedance to avoid the inrush current.

Figure 6B:
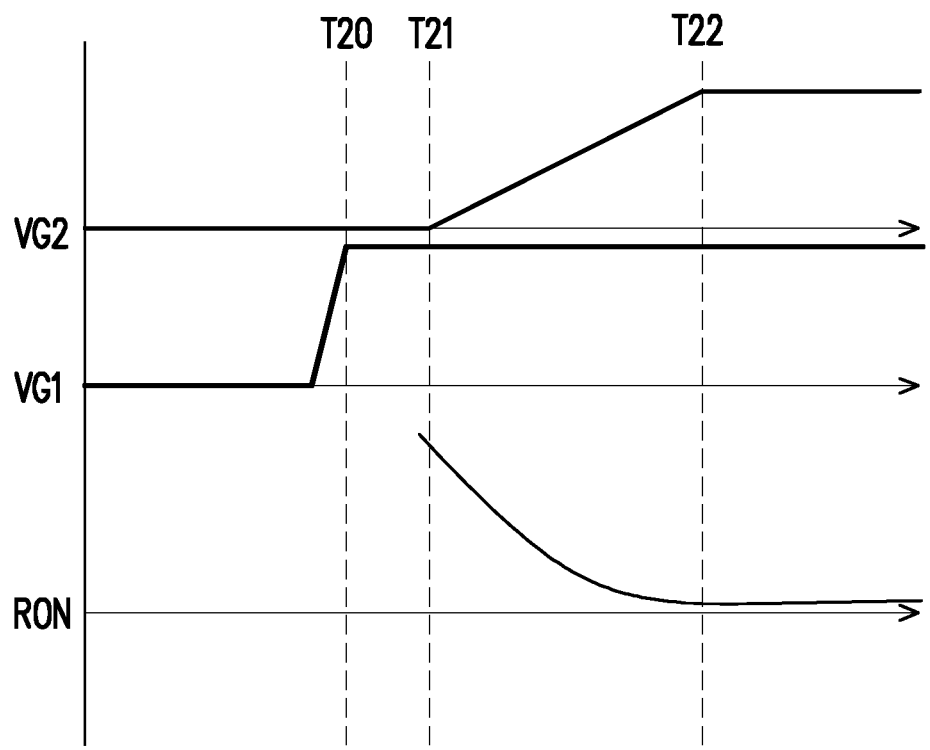
FIG. 6B is a waveform diagram of a first control voltage, a second control voltage, and an equivalent resistance between an input terminal and an output terminal of FIG. 3B according to an embodiment of the invention.

Operations of the control main body 124 of FIG. 5 will be described below with reference to FIG. 3B and FIG. 6B. FIG. 6B is a waveform diagram of the first control voltage VG1, the second control voltage VG2, and an equivalent resistance RON between the input terminal IP and the output terminal OP of FIG. 3B according to an embodiment of the invention. Referring to FIG. 3B, FIG. 5 and FIG. 6B together, in this embodiment, the determination signal DS of FIG. 5 indicates that the type of series connection between the first transistor M1 and the second transistor M2 of FIG. 3B is the common drain type of series connection. Therefore, after the first charge pump circuit 5241 generates the first control voltage VG1 to completely turn on the first transistor M1 (i.e., after a time point T20 of FIG. 6B), the second charge pump circuit 5242 starts generating the second control voltage VG2 to turn on the second transistor M2 at a time point T21, and completely turns on the second transistor M2 after a time point T22 to complete the soft start operation of the power switch circuit 100. It should be understood that, the first transistor M1 is completely turned on during a soft start interval between the time points T21 and T22. Therefore, the equivalent resistance RON between the input terminal IP and the output terminal OP is substantially controlled only by the second control voltage VG2 and smoothly changed from high impedance to low impedance to avoid the inrush current.

Figure 7:
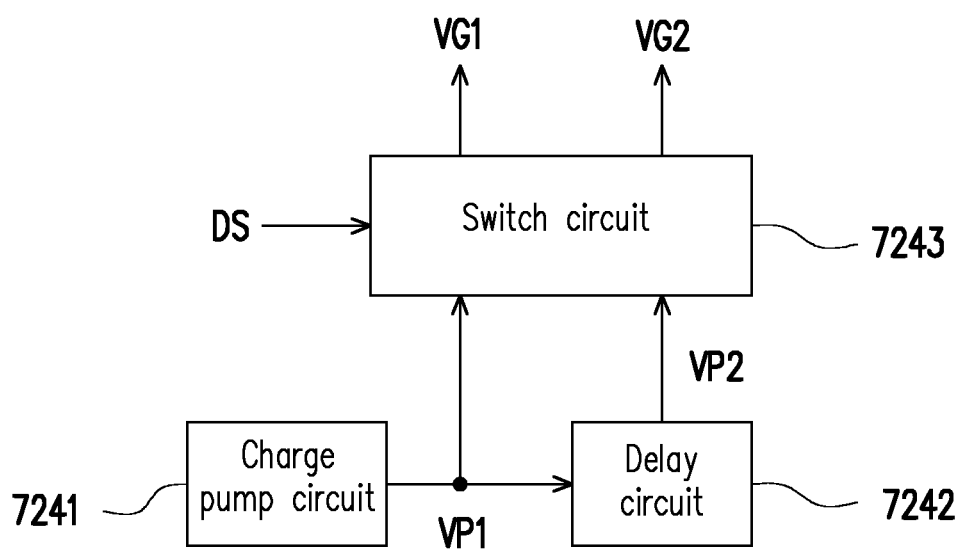
FIG. 7 is a circuit block diagram illustrating a control main body of FIG. 2 according to another embodiment of the invention.

FIG. 7 is a circuit block diagram illustrating the control main body 124 of FIG. 2 according to another embodiment of the invention. Referring to FIG. 2 and FIG. 7 together, the control main body 124 can include a charge pump circuit 7241, a delay circuit 7242 and a switch circuit 7243. The charge pump circuit 7241 is configured to generate a first pump voltage VP1. The delay circuit 7242 is coupled to the charge pump circuit 7241 to receive the first pump voltage VP1, and delays the first pump voltage VP1 to generate a second pump voltage VP2. Here, the second pump voltage VP2 starts to be transitioned after the first pump voltage VP1 is completely transitioned. The switch circuit 7243 is coupled to the charge pump circuit 7241 to receive the first pump voltage VP1, coupled to the delay circuit 7242 to receive the second pump voltage VP2, coupled to the determination circuit 122 to receive the determination signal DS, and coupled to the control end of the first transistor M1 and the control end of the second transistor M2 of FIG. 3A or FIG. 3B.

Referring to FIG. 3A, FIG. 6A and FIG. 7 together, in this embodiment, the determination signal DS indicates that the type of series connection between the first transistor M1 and the second transistor M2 of FIG. 3A is the common source type of series connection. Therefore, the switch circuit 7243 outputs the first pump voltage VP1 to the control end of the second transistor M2 as the second control voltage VG2, and the switch circuit 7243 outputs the second pump voltage VP2 to the control end of the first transistor M1 as the first control voltage VG1. Accordingly, after the second transistor M2 is completely turned on (i.e., after the time point T10 of FIG. 6A), the first control voltage VG1 starts controlling the turned-on state of the first transistor M1 at the time point T11, and completely turns on the first transistor M1 after the time point T12 to complete the soft start operation of the power switch circuit 100. It should be understood that, the second transistor M2 is completely turned on during the soft start interval between the time points T11 and T12. Therefore, the equivalent resistance RON between the input terminal IP and the output terminal OP is substantially controlled only by the first control voltage VG1 and smoothly changed from high impedance to low impedance to avoid the inrush current.

Referring to FIG. 3B, FIG. 6B and FIG. 7 together, in this embodiment, the determination signal DS indicates that the type of series connection between the first transistor M1 and the second transistor M2 of FIG. 3B is the common drain type of series connection. Therefore, the switch circuit 7243 outputs the first pump voltage VP1 to the control end of the first transistor M1 as the first control voltage VG1, and the switch circuit 7243 outputs the second pump voltage VP2 to the control end of the second transistor M2 as the second control voltage VG2. Accordingly, after the first transistor M1 is completely turned on (i.e., after the time point T20 of FIG. 6B), the second control voltage VG2 starts controlling the turned-on state of the second transistor M2 at the time point T21, and completely turns on the second transistor M2 after a time point T22 to complete the soft start operation of the power switch circuit 100. It should be understood that, the first transistor M1 is completely turned on during the soft start interval between the time points T21 and T22. Therefore, the equivalent resistance RON between the input terminal IP and the output terminal OP is substantially controlled only by the second control voltage VG2 and smoothly changed from high impedance to low impedance to avoid the inrush current.

Figure 8A:
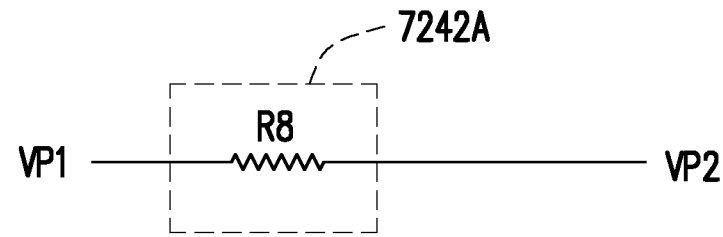
FIG. 8A to FIG. 8D are circuit block diagrams illustrating a delay circuit according to an embodiment of the invention.

FIG. 8A is a circuit block diagram illustrating a delay circuit 7242A which can be used as the delay circuit 7242 of FIG. 7 according to an embodiment of the invention. Referring to FIG. 7 and FIG. 8A together, the delay circuit 7242A includes a resistor R8. A first end of the resistor R8 is coupled to the charge pump circuit 7241 to receive the first pump voltage VP1, and a second end of the resistor R8 provides the second pump voltage VP2. In detail, the delay circuit 7242A delays the first pump voltage VP1 by a RC delay effect generated by the resistor R8 and a circuit parasitic capacitance so as to provide the second pump voltage VP2.

Figure 8B:
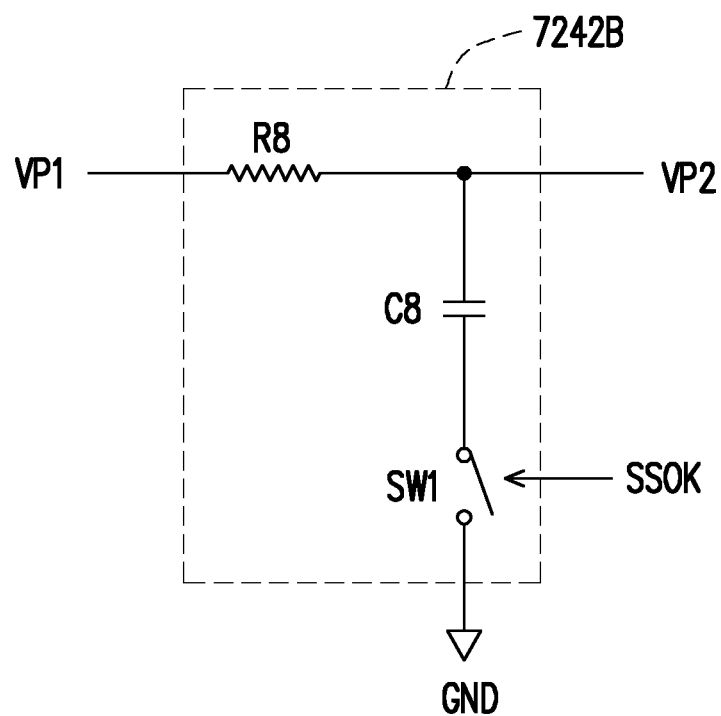

FIG. 8B is a circuit block diagram illustrating a delay circuit 7242B which can be used as the delay circuit 7242 of FIG. 7 according to another embodiment of the invention. Referring to FIG. 7 and FIG. 8B together, the delay circuit 7242B includes the resistor R8, a capacitor C8 and a switch SW1. The first end of the resistor R8 is coupled to the charge pump circuit 7241 to receive the first pump voltage VP1. The second end of the resistor R8 is coupled to a first end of the capacitor C8 to provide the second pump voltage VP2. The switch SW1 is coupled between a second end of the capacitor C8 and the ground terminal GND, and controlled to be open or closed by a soft start ready signal SSOK.

When the soft start ready signal SSOK indicates that the power switch circuit 100 of FIG. 3A (or FIG. 3B) does not complete the soft start, the switch SW1 is in the turned-on state. Therefore, the delay circuit 7242B delays the first pump voltage VP1 by a RC delay effect generated by the resistor R8 and the capacitor C8, so as to generate the second pump voltage VP2. In addition, when the soft start ready signal SSOK indicates that the power switch circuit 100 of FIG. 3A (or FIG. 3B) does complete the soft start, the switch SW1 is in the turned-off state, so that the second pump voltage VP2 is equal to the first pump voltage VP1.

Figure 8C:
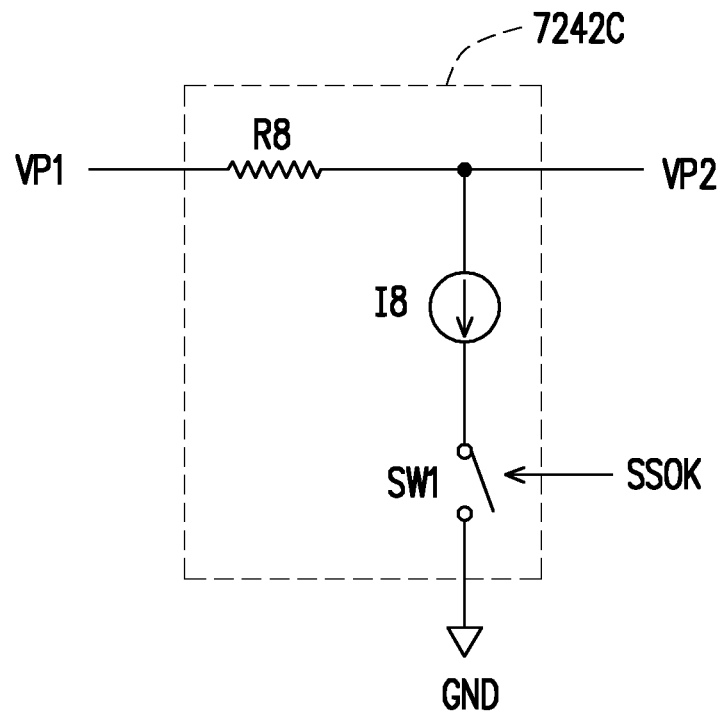

FIG. 8C is a circuit block diagram illustrating a delay circuit 7242C which can be used as the delay circuit 7242 of FIG. 7 according to yet another embodiment of the invention. Referring to FIG. 7 and FIG. 8C together, the delay circuit 7242C includes the resistor R8, a current source circuit 18 and the switch SW1. The first end of the resistor R8 is coupled to the charge pump circuit 7241 to receive the first pump voltage VP1. The second end of the resistor R8 is coupled to a first end of the current source circuit 18 to provide the second pump voltage VP2. The switch SW1 is coupled between a second end of the current source circuit 18 and the ground terminal GND, and controlled to be open or closed by the soft start ready signal SSOK.

Figure 9:
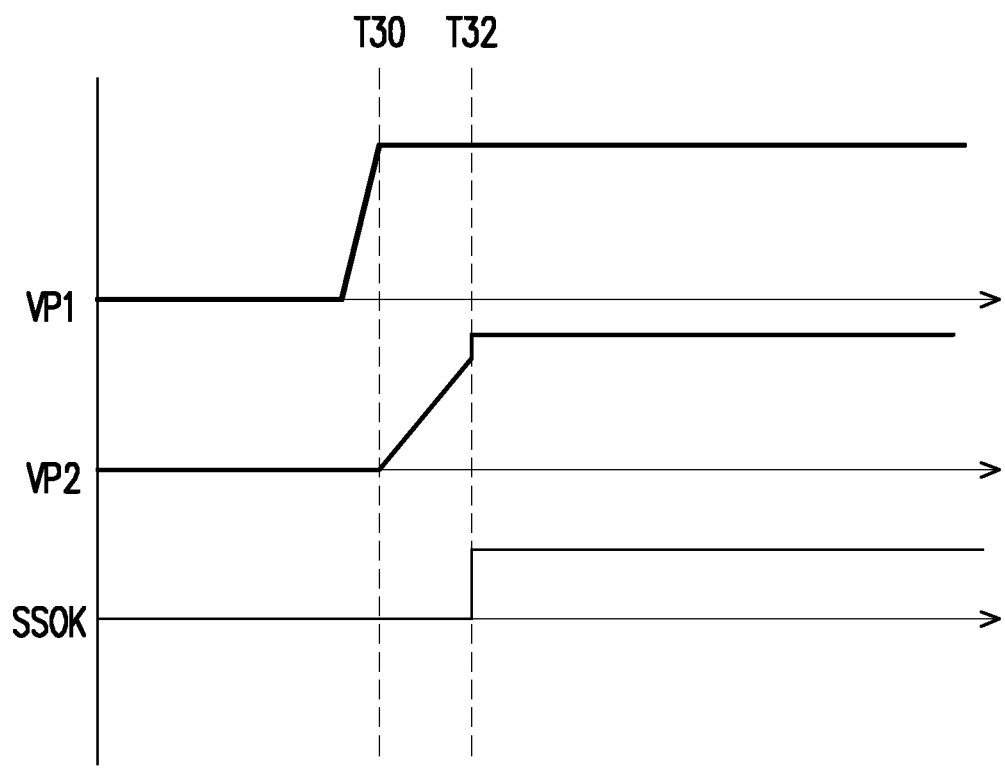
FIG. 9 is a timing diagram of a first pump voltage, a second pump voltage, and a soft start ready signal according to an embodiment of the invention.

FIG. 9 is a timing diagram of the first pump voltage VP1, the second pump voltage VP2, and the soft start ready signal SSOK according to an embodiment of the invention. Referring to FIG. 8C and FIG. 9 together, when the soft start ready signal SSOK indicates that the power switch circuit 100 of FIG. 3A (or FIG. 3B) does not complete the soft start (i.e., before a time point T32 of FIG. 9), the switch SW1 is in the turned-on state, so that the current source circuit 18 can generate a current for generating a voltage drop between the first end and the second end of the resistor R8. Here, the second pump voltage VP2 is lower than the first pump voltage VP1, and the second pump voltage VP2 starts to be transitioned after the first pump voltage VP1 is completely transitioned (i.e., after a time point T30). In addition, when the soft start ready signal SSOK indicates that the power switch circuit 100 of FIG. 3A (or FIG. 3B) does complete the soft start (i.e., after the time point T32), the switch SW1 is in the turned-off state, so that the current source circuit 18 stops generating the current, and the second pump voltage VP2 is equal to the first pump voltage VP1.

Figure 8D:
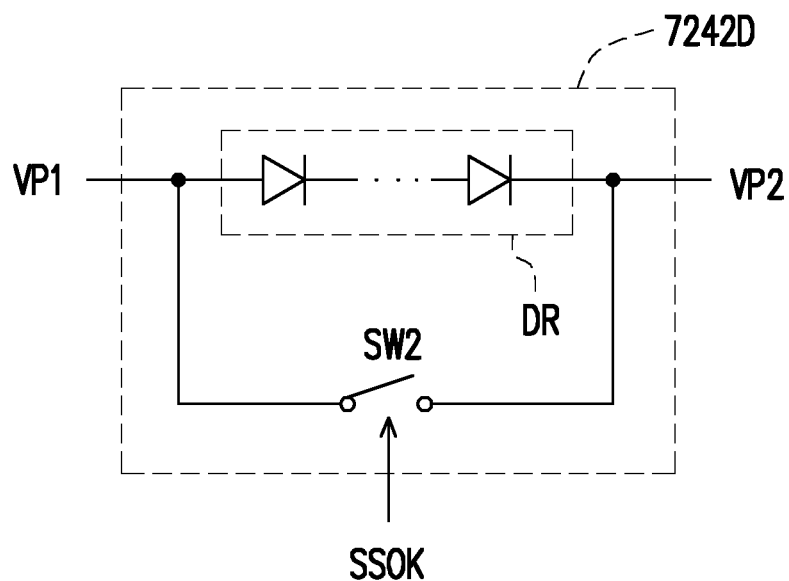

FIG. 8D is a circuit block diagram illustrating a delay circuit 7242D which can be used as the delay circuit 7242 of FIG. 7 according to yet another embodiment of the invention. Referring to FIG. 7 and FIG. 8D together, the delay circuit 7242D includes a diode string DR and a switch SW2. The diode string DR has one or more diodes connected in series. An anode end of the diode string DR is coupled to the charge pump circuit 7241 to receive the first pump voltage VP1. A cathode end of the diode string DR can provide the second pump voltage VP2. The switch SW2 is coupled between the anode end and the cathode end of the diode string DR, and controlled to be open or closed by the soft start ready signal SSOK.

Referring to FIG. 8D and FIG. 9 together, when the soft start ready signal SSOK indicates that the power switch circuit 100 of FIG. 3A (or FIG. 3B) does not complete the soft start (i.e., before the time point T32), the switch SW2 is in the turned-off state, so that the second pump voltage VP2 is lower than the first pump voltage VP1, and the second pump voltage VP2 starts to be transitioned after the first pump voltage VP1 is completely transitioned (i.e., after the time point T30). In addition, when the soft start ready signal SSOK indicates that the power switch circuit 100 of FIG. 3A (or FIG. 3B) does complete the soft start (i.e., after the time point T32), the switch SW2 is in the turned-on state, so that the second pump voltage VP2 is equal to the first pump voltage VP1.

In summary, in the power switch circuit proposed by the embodiments of the invention, the control circuit can determine the type of series connection between the first transistor and the second transistor, and controls the first transistor and the second transistor according to the type of series connection between the first transistor and the second transistor. The control circuit controls the turned-on state of another of the first transistor and the second transistor after completely turning on one of the first transistor and the second transistor. In this way, the time interval in which the first transistor is switched from the turned-off state to the turned-on state does not overlap with the time interval in which the second transistor is switched from the turned-off state to the turned-on state at all. As a result, the soft start failure caused by the inrush current generated by the power switch circuit during the startup can be prevented.

Although the present disclosure has been described with reference to the above embodiments, it will be apparent to one of ordinary skill in the art that modifications to the described embodiments may be made without departing from the spirit of the disclosure. Accordingly, the scope of the disclosure will be defined by the attached claims and not by the above detailed descriptions.

The invention claimed is:

1. A power switch circuit, comprising:
a first transistor, having a first end, a second end and a control end, wherein the first end of the first transistor is configured to serve as an input terminal of the power switch circuit, the second end of the first transistor is coupled to a node, and a control end of the first transistor is configured to receive a first control voltage;
a second transistor, having a first end, a second end and a control end, wherein the first end of the second transistor is configured to serve as an output terminal of the power switch circuit, the second end of the second transistor is coupled to the node, and a control end of the second transistor is configured to receive a second control voltage; and
a control circuit, coupled to the node, the control end of the first transistor and the control end of the second transistor, wherein the control circuit detects a voltage of the node, determines a type of series connection between the first transistor and the second transistor according to the voltage of the node, and generates the first control voltage and the second control voltage according to the type of series connection, so as to start controlling a turned-on state of another of the first transistor and the second transistor after completely turning on one of the first transistor and the second transistor.

2. The power switch circuit according to claim 1, wherein the control circuit comprises:
a determination circuit, configured to detect the voltage of the node, and determine the type of series connection between the first transistor and the second transistor according to the voltage of the node to generate a determination signal; and
a control main body, coupled to the determination circuit to receive the determination signal, and generating the first control voltage and the second control voltage according to the determination signal.

3. The power switch circuit according to claim 2, wherein each of the first transistor and the second transistor is an N-type metal-oxide-semiconductor field-effect transistor, wherein if the determination signal indicates that the type of series connection between the first transistor and the second transistor is a common source type of series connection, the control main body starts switching over to the first control voltage to turn on the first transistor after switching over to the second control voltage to completely turn on the second transistor.

4. The power switch circuit according to claim 2, wherein each of the first transistor and the second transistor is an N-type metal-oxide-semiconductor field-effect transistor, wherein if the determination signal indicates that the type of series connection between the first transistor and the second transistor is a common drain type of series connection, the control main body starts switching over to the second control voltage to turn on the second transistor after switching over to the first control voltage to completely turn on the first transistor.

5. The power switch circuit according to claim 2, wherein the determination circuit comprises:
a third transistor, a first end of the third transistor being coupled to a ground terminal, a control end of the third transistor being coupled to the node;
a bias circuit, a first end of the bias circuit being coupled to a second end of the third transistor to generate a detection signal, a second end of the bias circuit being coupled to a power terminal; and
a logic circuit, coupled to the first end of the bias circuit and the second end of the third transistor to receive the detection signal, and generating the determination signal according to the detection signal.

6. The power switch circuit according to claim 2, wherein each of the first transistor and the second transistor is an N-type metal-oxide-semiconductor field-effect transistor, and the control main body comprises:
a first charge pump circuit, coupled to the determination circuit to receive the determination signal, and generating the first control voltage according to the determination signal; and
a second charge pump circuit, coupled to the determination circuit to receive the determination signal, and generating the second control voltage according to the determination signal,
wherein if the determination signal indicates that the type of series connection between the first transistor and the second transistor is a common source type of series connection, the first charge pump circuit starts generating the first control voltage to turn on the first transistor after the second charge pump circuit generates the second control voltage to completely turn on the second transistor,
wherein if the determination signal indicates that the type of series connection between the first transistor and the second transistor is a common drain type of series connection, the second charge pump circuit starts generating the second control voltage to turn on the second transistor after the first charge pump circuit generates the first control voltage to completely turn on the first transistor.

7. The power switch circuit according to claim 2, wherein each of the first transistor and the second transistor is an N-type metal-oxide-semiconductor field-effect transistor, and the control main body comprises:
   a charge pump circuit, configured to generate a first pump voltage;
   a delay circuit, coupled to the charge pump circuit to receive the first pump voltage, and delaying the first pump voltage to generate a second pump voltage, wherein the second pump voltage starts to be transitioned after the first pump voltage is completely transitioned; and
   a switch circuit, coupled to the charge pump circuit to receive the first pump voltage, coupled to the delay circuit to receive the second pump voltage, coupled to the determination circuit to receive the determination signal, and coupled to the control end of the first transistor and the control end of the second transistor,
   wherein if the determination signal indicates that the type of series connection between the first transistor and the second transistor is a common source type of series connection, the switch circuit outputs the first pump voltage to the control end of the second transistor as the second control voltage, and the switch circuit outputs the second pump voltage to the control end of the first transistor as the first control voltage,
   wherein if the determination signal indicates that the type of series connection between the first transistor and the second transistor is a common drain type of series connection, the switch circuit outputs the first pump voltage to the control end of the first transistor as the first control voltage, and the switch circuit outputs the second pump voltage to the control end of the second transistor as the second control voltage.

8. The power switch circuit according to claim 7, wherein the delay circuit comprises:
   a resistor, a first end of the resistor being coupled to the charge pump circuit to receive the first pump voltage, a second end of the resistor providing the second pump voltage.

9. The power switch circuit according to claim 8, wherein the delay circuit further comprises:
   a capacitor, a first end of the capacitor being coupled to the second end of the resistor; and
   a switch, coupled between a second end of the capacitor and a ground terminal, and controlled to be open or closed by a soft start ready signal,
   wherein when the soft start ready signal indicates that the power switch circuit does not complete a soft start, the switch is in a turned-on state,
   wherein when the soft start ready signal indicates that the power switch circuit does complete the soft start, the switch is in a turned-off state.

10. The power switch circuit according to claim 8, wherein the delay circuit further comprises:
    a current source circuit, a first end of the current source circuit being coupled to the second end of the resistor; and
    a switch, coupled between a second end the current source circuit and a ground terminal, and controlled to be open or closed by a soft start ready signal,
    wherein when the soft start ready signal indicates that the power switch circuit does not complete a soft start, the switch is in a turned-on state, so that the current source circuit generates a current for generating a voltage drop between the first end of the resistor and the second end of the resistor, wherein the second pump voltage is lower than the first pump voltage,
    wherein when the soft start ready signal indicates that the power switch circuit does complete the soft start, the switch is in a turned-off state, so that the current source circuit stops generating the current, and the second pump voltage is equal to the first pump voltage.

11. The power switch circuit according to claim 7, wherein the delay circuit comprises:
    a diode string, an anode end of the diode string being coupled to the charge pump circuit to receive the first pump voltage, a cathode end of the diode string providing the second pump voltage; and
    a switch, coupled between the anode end and the cathode end of the diode string, and controlled to be open or closed by a soft start ready signal,
    wherein when the soft start ready signal indicates that the power switch circuit does not complete a soft start, the switch is in a turned-off state, so that the second pump voltage is lower than the first pump voltage,
    wherein when the soft start ready signal indicates that the power switch circuit does complete the soft start, the switch is in a turned-on state, so that the second pump voltage is equal to the first pump voltage.

\* \* \* \* \*